United States Patent
Lane et al.

(10) Patent No.: US 11,262,650 B1
(45) Date of Patent: Mar. 1, 2022

(54) REDUCING ADHESIVE FAILURE DURING NANOIMPRINT LITHOGRAPHY DEMOLDING

(71) Applicant: Facebook Technologies, LLC, Menlo Park, CA (US)

(72) Inventors: Austin Lane, Redmond, WA (US); Tingling Rao, Bellevue, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 600 days.

(21) Appl. No.: 16/216,798

(22) Filed: Dec. 11, 2018

(51) Int. Cl.
*G03F 7/00* (2006.01)
*B82Y 40/00* (2011.01)
*G03F 7/09* (2006.01)

(52) U.S. Cl.
CPC .............. *G03F 7/0002* (2013.01); *G03F 7/09* (2013.01); *B82Y 40/00* (2013.01)

(58) Field of Classification Search
CPC ......... G03F 7/0002; G03F 7/09; B82Y 40/00; B32B 38/06; B32B 2307/748; B29C 37/0028; B29C 33/68; B29C 33/58
See application file for complete search history.

(56) References Cited

U.S. PATENT DOCUMENTS

| | | | |
|---|---|---|---|
| 4,090,997 A | 5/1978 | Patel et al. | |
| 4,535,041 A | 8/1985 | Fielding et al. | |
| 5,079,131 A | 1/1992 | Thackeray et al. | |
| 5,212,028 A | 5/1993 | Fujino | |
| 5,278,029 A | 1/1994 | Shirai et al. | |
| 5,407,787 A | 4/1995 | McElhanon et al. | |
| 5,658,711 A | 8/1997 | Matsuo et al. | |

(Continued)

FOREIGN PATENT DOCUMENTS

| | | |
|---|---|---|
| JP | H03146954 A | 6/1991 |
| JP | H1073713 A | 3/1998 |

OTHER PUBLICATIONS

Mao, Yu, and Karen K. Gleason. "Vapor-deposited fluorinated glycidyl copolymer thin films with low surface energy and improved mechanical properties." Macromolecules 39.11 (2006): 3895-3900. (Year: 2006).*

(Continued)

*Primary Examiner* — Leith S Shafi
(74) *Attorney, Agent, or Firm* — Fenwick & West LLP

(57) ABSTRACT

Embodiments relate to a method of fabricating a nano-sized structure in a resin element by nanoimprint lithography (NIL). The method reduces adhesive failure during NIL demolding by inhibiting polymerization at the interface between the resin element and the template. The method includes depositing a layer of polymerization inhibiting compound onto a surface of the template. The layer of polymerization inhibiting compound has a thickness no more than 10 nanometers. A surface of the template has a nano-sized pattern that mirrors that nano-sized structure. The method further includes pressing the template onto the resin element (or the resin element onto the template) to form the nano-sized structure in the resin element. The process also includes curing the resin element after forming the nano-sized structure and removing the template from the resin element after curing the resin element. The polymerization inhibiting compound prevents adhesive failure during the removing.

5 Claims, 10 Drawing Sheets

(56) References Cited

U.S. PATENT DOCUMENTS

| | | | |
|---|---|---|---|
| 6,358,653 B1 | 3/2002 | Turberfield et al. | |
| 6,372,406 B1 | 4/2002 | Brunsvold et al. | |
| 6,379,869 B1 | 4/2002 | Schroeder et al. | |
| 6,673,525 B1 | 1/2004 | Wheeler | |
| 8,198,018 B2 | 6/2012 | Mennig et al. | |
| 10,857,724 B1* | 12/2020 | Lane | B32B 3/30 |
| 11,173,649 B1* | 11/2021 | Lane | G03F 7/0002 |
| 2004/0115566 A1 | 6/2004 | Reichmanis et al. | |
| 2005/0271900 A1* | 12/2005 | Kobrin | B05D 1/185 |
| | | | 428/701 |
| 2006/0281320 A1 | 12/2006 | Lin et al. | |
| 2007/0282030 A1 | 12/2007 | Anderson et al. | |
| 2008/0131791 A1 | 6/2008 | Cho et al. | |
| 2008/0254375 A1 | 10/2008 | Hayashida et al. | |
| 2010/0038831 A1* | 2/2010 | Kawaguchi | B82Y 10/00 |
| | | | 264/496 |
| 2011/0008577 A1* | 1/2011 | Miyake | G03F 7/038 |
| | | | 428/156 |
| 2011/0319516 A1* | 12/2011 | Xu | G03F 7/0002 |
| | | | 522/79 |
| 2013/0108956 A1 | 5/2013 | Lu et al. | |
| 2013/0281713 A1 | 10/2013 | Willson et al. | |
| 2014/0030660 A1 | 1/2014 | Takanashi et al. | |
| 2014/0054822 A1 | 2/2014 | Ellison et al. | |
| 2014/0209565 A1* | 7/2014 | Nakamura | B29C 33/58 |
| | | | 216/41 |
| 2014/0235727 A1 | 8/2014 | Tufts et al. | |
| 2015/0079793 A1 | 3/2015 | Hattori et al. | |
| 2015/0099228 A1 | 4/2015 | Hatakeyama et al. | |
| 2015/0301452 A1 | 10/2015 | Park et al. | |
| 2017/0371240 A1 | 12/2017 | Liu et al. | |
| 2020/0090987 A1 | 3/2020 | Chandhok et al. | |
| 2020/0131337 A1 | 4/2020 | Matsumura | |

OTHER PUBLICATIONS

United States Office Action, U.S. Appl. No. 16/216,803, dated Sep. 2, 2020, 14 pages.
Final Office Action dated Jul. 8, 2021 U.S. Appl. No. 16/216,803, filed Dec. 11, 2018, 16 pages.
United States Office Action, U.S. Appl. No. 16/216,803, dated Feb. 17, 2021, 13 pages.
United States Office Action, U.S. Appl. No. 16/216,809, dated Jun. 11, 2020, 10 pages.
Campbell et al., "Fabrication of Photonic Crystals for the Visible Spectrum by Holographic Lithography", Nature, vol. 404, Mar. 2000, pp. 53-56.
ChemSpider, Royal Society of Chemisty, Boiling Point Data for 3, 6-Dihydro2H-Pyran, 2021, 3 Pages.
Ciapurin I.V., et al., "Modeling of Phase Volume Diffractive Gratings, Part 1: Transmitting Sinusoidal Uniform Gratings," Optical Engineering, Jan. 2006, vol. 45 (1), pp. 1-9.
Pham V.Q., et al., "Positive Tone Photoresist Process for Supercritical Carbon Dioxide Development", Chemistry of Materials, American Chemical Society, 2003, vol. 15 (26), pp. 4893-4895.
Stein A., et al., "Design and Functionality of Colloidal-Crystal-Templated Materials-Chemical Applications of Inverse Opals," Chemical Society Reviews, 2013, vol. 42, pp. 2763-2803.

* cited by examiner

REDUCING ADHESIVE FAILURE DURING NANOIMPRINT LITHOGRAPHY DEMOLDING

BACKGROUND

The present disclosure generally relates to fabricating a nano-sized structure in a resin element by using nanoimprint lithography (NIL), and specifically relates to reducing adhesive failure during ML demolding by forming a layer of polymerization inhibiting compound at the interface between the molded resin element and the template.

NIL is widely used to fabricate nanometer scale patterns. Nanoimprint lithography is a method of fabricating nanostructure by using a mold having a nano-sized pattern to mold an imprint resist. The imprint resist can be a resin element. Demolding, the process to separate the template from the molded resin element, is one of the processed performed in NIL. Adhesive failure during demolding can destroy the nano-sized structure formed in the molded resin element.

SUMMARY

Embodiments relate to fabricating a nano-sized structure in a resin element by nanoimprint lithography (NIL), where adhesive failure during NIL demolding is reduced by inhibiting polymerization at the interface of the template and the molded resin element. A layer of a polymerization inhibiting compound is deposited onto a surface of the template that contacts with the resin element during the fabrication. The surface of the template has a nano-sized pattern, which is a mirror image of the nano-sized structure formed in the resin element.

In one or more embodiments, the polymerization inhibiting compound is a polymer that includes functional groups such as amine, phenol, quinone, nitroso, and/or persistent free radical. The deposition is performed by initiated chemical vapor deposition, atomic layer deposition, vapor deposition, or any combination thereof. The deposited layer of the polymerization inhibiting compound has a thickness no more than 10 nanometers (nm). Before the deposition, the template has been exposed to oxygen plasma to increase the concentration of hydroxyl groups at the surface associated with the nano-sized pattern so that the polymerization inhibiting compound can chemically bond to the template.

In one or more embodiments, the surface of the template is pressed onto a resin element or the resin element onto the surface of the template to form a nano-sized structure in the resin element. Thus, the layer of the polymerization inhibiting compounds is at the interface of the template and the resin element. The resin element is cured after the nano-sized structure is formed in the resin element. The template is removed from the resin element (i.e., demolding) after the resin element is cured. The polymerization inhibiting compound inhibits polymerization at the template/resin element interface during the curing and therefore, functions as a lubrication layer. Accordingly, adhesive failure during demolding is inhibited.

The figures depict embodiments of the present disclosure for purposes of illustration only.

DETAILED DESCRIPTION

A nanostructure is fabricated in a resin element by pressing a template onto the resin element. A surface of the template has a nano-sized pattern and contacts with the resin element during the pressing. A layer of polymerization inhibiting compound is formed at the interface of the template and the resin element before or during the pressing. The polymerization inhibiting compound includes one or more functional groups that inhibit polymerization at the interface so that the interface is not adhesive. Therefore, adhesive failure during demolding is inhibited.

Figure 1:
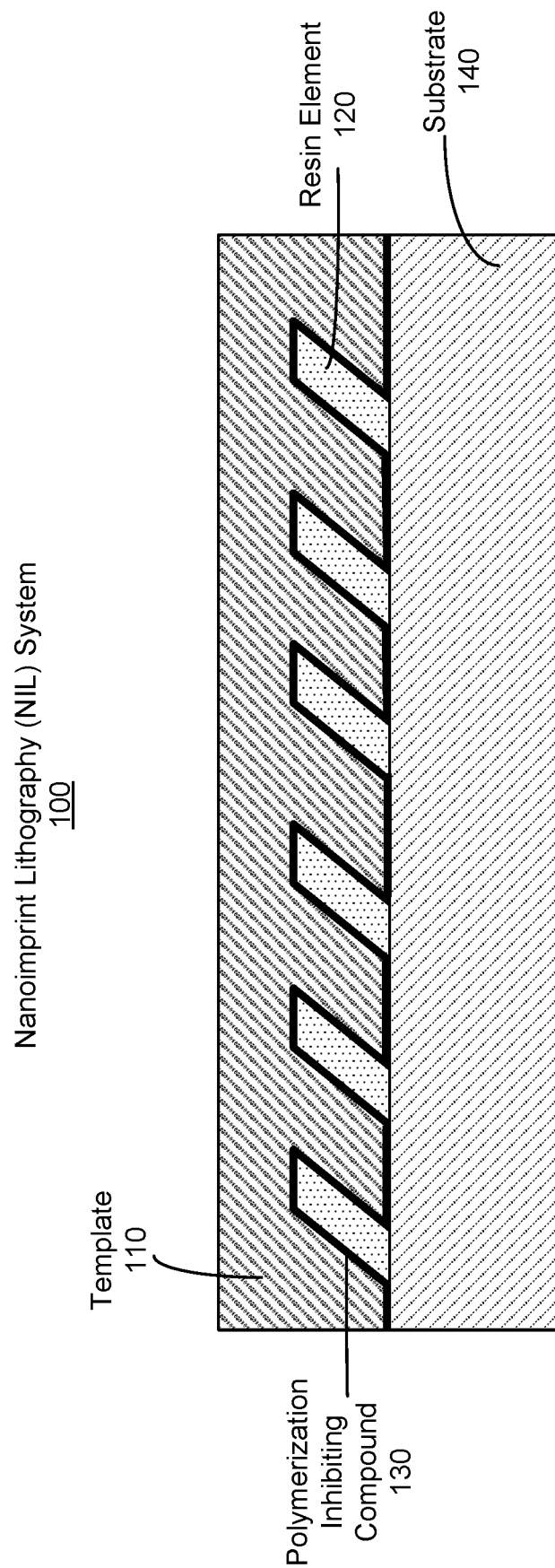
FIG. 1 is a cross-sectional view of a nanoimprint lithography (NIL) system that includes a template, a resin element, and a layer of a polymerization inhibiting compounds at the interface of the template and the resin element, in accordance with an embodiment.

FIG. 1 is a cross-sectional view of a NIL system 100 that includes a template 110, a resin element 120, and a layer of a polymerization inhibiting compound 130 at the interface of the template 110 and the resin element 120, in accordance with an embodiment. The template 110 is pressed onto the resin element 120. The template 110 has a nano-sized pattern on one of its surfaces. Dimensions of the nano-sized pattern are in a range from 1 nm to 100 nm. In the example of FIG. 1, the nano-sized pattern is parallelogram. In other examples, the nano-sized pattern can have other types of configurations, such as triangle, rectangular, etc. The surface of the template 110 that has the nano-sized pattern contacts with the resin element 120. When the template 110 is pressed onto the resin element 120, a nano-sized structure is formed in the resin element 120. The nano-sized structure has a pattern that is a mirror image of the nano-sized pattern of the template 110.

The template 110 can be a hard template. The hard template has a rigid structure (i.e., including a rigid nano-sized pattern). It can be made from polymer microspheres, porous membrane, plastic foam, ion exchange resin, carbon fiber, porous anodic aluminum oxide, or other types of rigid materials. Because the nano-sized pattern is rigid, the dimensions and configuration of the nano-sized structure in the resin element 120 can be precisely controlled. The template 110 can also be a soft template. Different from the hard template, the soft template has a flexible structure. The soft template can be made from surfactant, polymer, biopolymer, or other types of non-rigid materials. Compared with the hard template, the soft template is easier to build and remove. Also, it does not require complex equipment and strict production conditions.

The resin element 120 includes a resin having low surface energy, such as a fluorine resin. In one example, the resin element 120 comprises a fluorinated phenolic resin. Because the surface energy is low, the resin element is not sticky, which facilitates demolding (i.e., removing the template 110 from the resin element 120 after the nano-sized structure is formed). In the embodiment of FIG. 1, the resin element 120 is attached on a substrate 140. The resin element 120 can be spin coated on the substrate 140. An example of the substrate 140 is glass.

The layer of the polymerization inhibiting compound 130 is at the interface of the template 110 and the resin element 120. In some embodiments, the thickness of the layer is no more than 10 nm to avoid destroying the nano-sized pattern 215. In one embodiment, the thickness of the layer is in the range from 5 nm to 10 nm. The polymerization inhibiting compound 130 is a polymer that includes at least one of the following functional groups: amine, phenol, quinone, nitroso, persistent free radical, or some combination thereof. Examples of persistent free radicals include nitroxide, alkoxyamine, etc. The functional groups inhibit polymerization at the interface so that the interface is not adhesive. Therefore, it is easy to remove the template 110 from the resin element 120. And, adhesive failure during demolding is prevented. The layer of the polymerization inhibiting compound 130 can be formed by different process, including depositing the polymerization inhibiting compound 130 onto the template 110, diffusing the polymerization inhibiting compound 130 from the template 110 to the interface, or promoting migration of the polymerization inhibiting compound 130 from the resin element 120 to the interface. These processes are described below in detail.

Figure 2A:
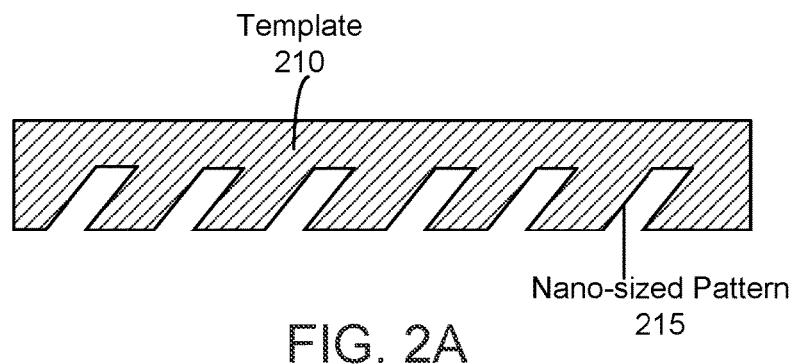
FIGS. 2A through 2E illustrate a NIL process that includes depositing a layer of the polymerization inhibiting compound onto a template, in accordance with an embodiment.

FIGS. 2A through 2E illustrate a NIL process that includes depositing a layer of a polymerization inhibiting compound 220 onto a template 210, in accordance with an embodiment. FIG. 2A shows the template 210. A surface of the template 210 facing resin element 230 has a nano-sized pattern 215. The template 210 can be either a hard template or a soft template.

Figure 2B:
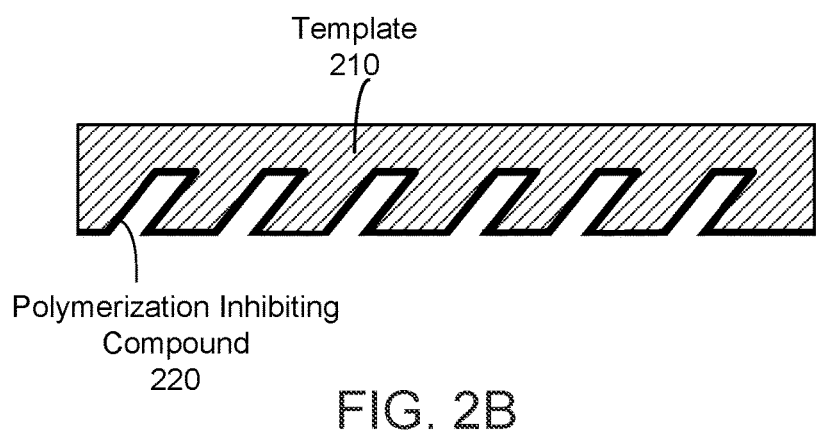

FIG. 2B shows a layer of the polymerization inhibiting compound 220 deposited on the surface of the template 210 that has the nano-sized pattern 215. An example of the polymerization inhibiting compound 220 is the polymerization inhibiting compound 130 described above in conjunction with FIG. 1. The deposition is monolayer deposition so that the thickness of the layer is controlled to be no more than 10 nm. The deposited layer therefore conforms to the nano-sized pattern 215, even the nano-sized pattern 215 is a complicated pattern.

The polymerization inhibiting compound 220 can be deposited physically or chemically. For example, the polymerization inhibiting compound 220 is deposited by using vapor deposition, initiated chemical vapor deposition (iCVD), atomic layer deposition (ALD), other types of deposition methods, or some combination thereof. The vapor deposition may be conducted under a reduced pressure. The iCVD may be conducted at a temperature no more than 100° C. so that chemistry of the polymerization inhibiting compound 220 and the template 210 are not affected during the deposition. In embodiments where the polymerization inhibiting compound is chemically deposited onto the surface of the template 210, the template 210 is prepared to be ready for the deposition beforehand. For example, before the chemical deposition, the template 210 is exposed to oxygen plasma to increase the concentration of hydroxyl groups at the surface having the nano-sized pattern 215. With the increased concentration of hydroxyl groups at the surface, the deposited polymerization inhibiting compound 220 can chemically bond to the surface. Alternatively or additionally, the polymerization inhibiting compound 220 can include a moiety that can chemically bond to the surface of the template 210 through coupling chemistry, such as alkoxysilane, chlorosilane, etc.

Figure 2C:
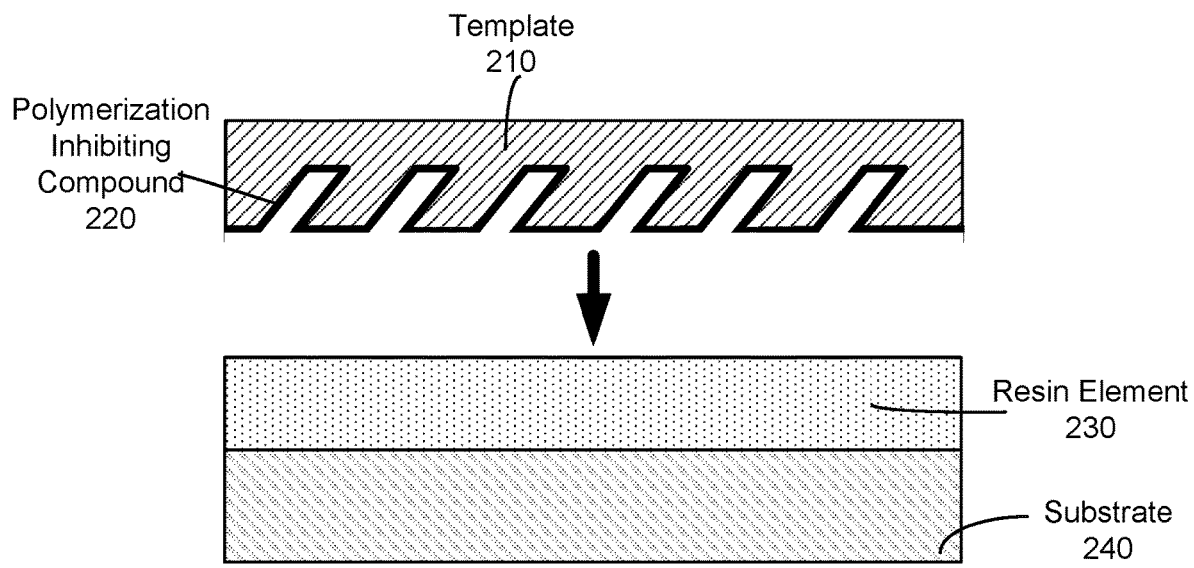

After the layer of the polymerization inhibiting compound 220 is deposited, the template 210 is pressed onto the resin element 230 attached on a substrate 240, as shown in FIG. 2C. An example of the resin element 230 is the resin element 120 described above in conjunction with FIG. 1. An example of the substrate 240 is the substrate 140 in FIG. 1. The resin element 230 is moldable. In the embodiment of FIG. 2C, the template 210 is pressed onto the resin element 230 to mold the resin element 230. The surface of the template 210 that has the nano-sized pattern 215 contacts with the resin element 230. In other embodiments, the resin element 230 is pressed on to the template 210.

Figure 2D:
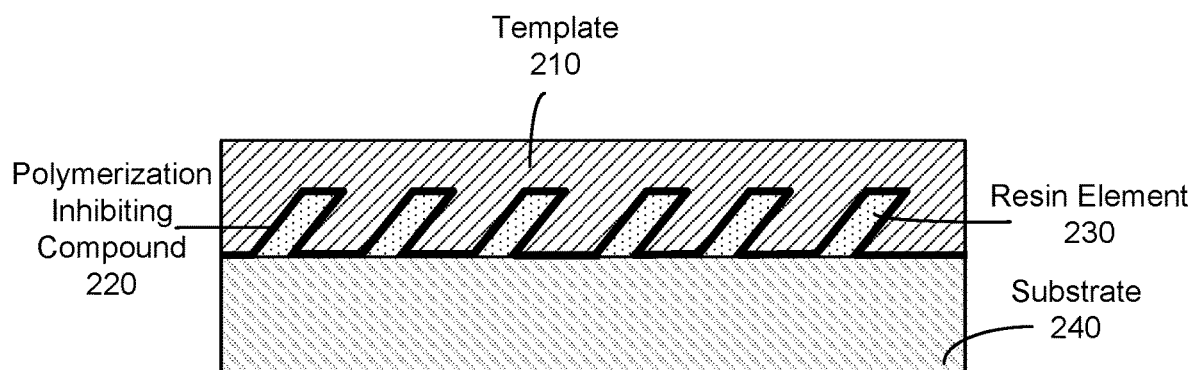

The pressing is completed in FIG. 2D, where the resin element 230 is molded with the nano-sized pattern 215 of the template 210 and a nano-sized structure that is a mirror image of the nano-sized pattern 215 is formed in the resin element 240. After the nano-sized structure is formed and before the template 210 is removed, the resin element 230 is cured to become rigid. The resin element 230 can be cured by free radical curing, cationic curing, or other types of curing methods. In some embodiments, the curing method is determined based on what functional groups the polymerization inhibiting compound 220 has. For example, if the primary functional group of the polymerization inhibiting compound is amine, the resin element 230 is cured with cationic curing. As another example, if the polymerization inhibiting compound 2230 has functional groups such as phenol, quinone, nitroso, or persistent free radicals, the resin element 230 is cured with free radical curing. In the example of free radical curing, the polymerization inhibiting compound 220 includes a compound that reacts and neutralize with the free radical generator used for the free radical curing before the curing so that the polymerization inhibiting compound 220 would not impact the curing process.

Figure 2E:
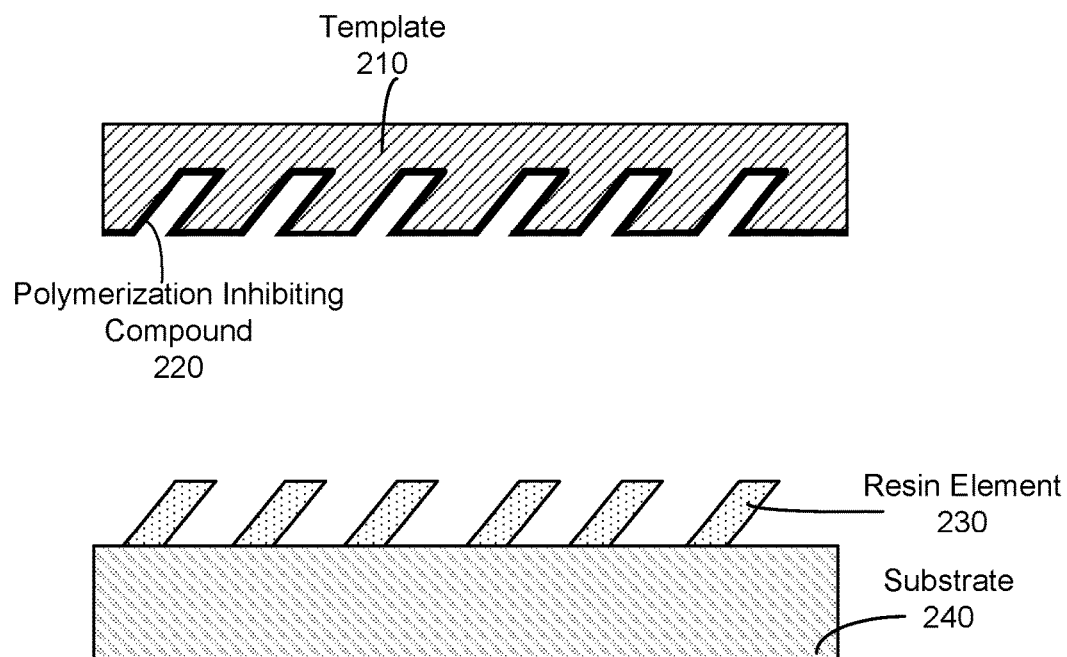

After the resin element 230 is cured, the template 210 is removed from the resin element 230, as shown in FIG. 2E. This is the demolding process. Because the polymerization inhibiting compound 220 inhibits polymerization at the interface between the template 210 and the resin element 230, the interface is lubricated. Therefore, when the template 210 is removed from the molded resin element 230, there is no adhesive failure and the nano-sized structure of the molded resin element 230 is not affected by the demolding.

Figure 3:
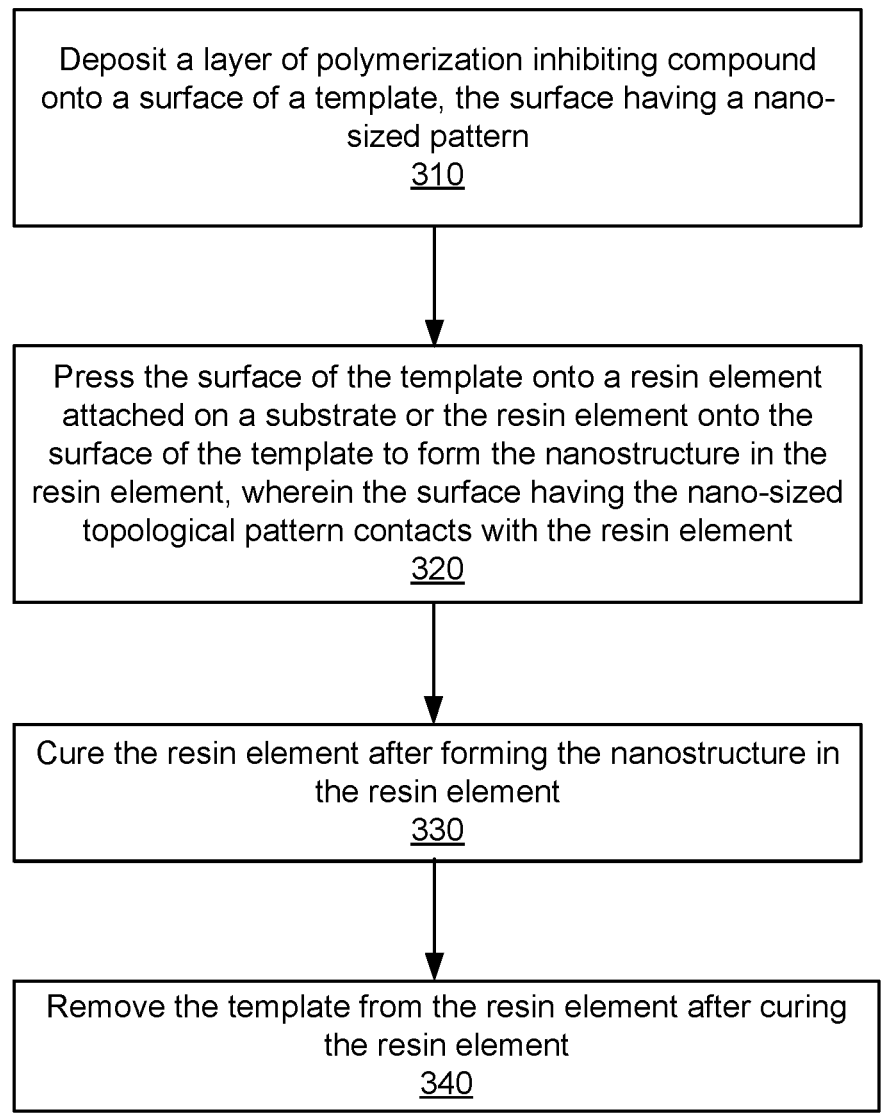
FIG. 3 is a flowchart illustrating the NIL process in FIGS. 2A through 2E, in accordance with an embodiment.

FIG. 3 is a flowchart illustrating the NIL process in FIGS. 2A through 2E, in accordance with an embodiment. The NIL process includes depositing 310 a layer of polymerization inhibiting compound onto a surface of a template. The surface has a nano-sized pattern. The layer has a thickness in a range from 5 nm to 10 nm. The layer can be deposited physically or chemically onto the surface of the template. In embodiments where the layer is deposited chemically, the template is exposed to oxygen plasma to increase the concentration of hydroxyl groups at the surface before the deposition to enhance chemical bonding between the polymerization inhibiting compound and the template. The deposition may be conducted at a temperature below 100° C. to preserve the nano-sized pattern of the template.

The NIL process also includes pressing 320 the surface of the template onto a resin element or the resin element onto the surface of the template to form the nano-sized structure in the resin element. The resin element is attached on a substrate.

The NIL process further includes curing 330 the resin element after forming the nano-sized structure in the resin element. The resin element can be cured by free radical curing or cationic curing.

Finally, the NIL process includes removing 340 the template from the resin element after curing the resin element. The functional groups of the polymerization inhibiting compound inhibit polymerization at the interface of the template and the resin element so that it is not adhesive at the interface. When the template is removed, the nano-sized structure formed in the resin element will be preserved.

The NIL process is advantageous for fabricating complicated nano-sized structures because the deposited layer of the polymerization inhibiting compound conforms to the nano-sized pattern of the template. And, the thickness of the layer is even across the whole deposited area. It is easy to control the thickness of the layer by conducting monolayer deposition.

Figure 4A:
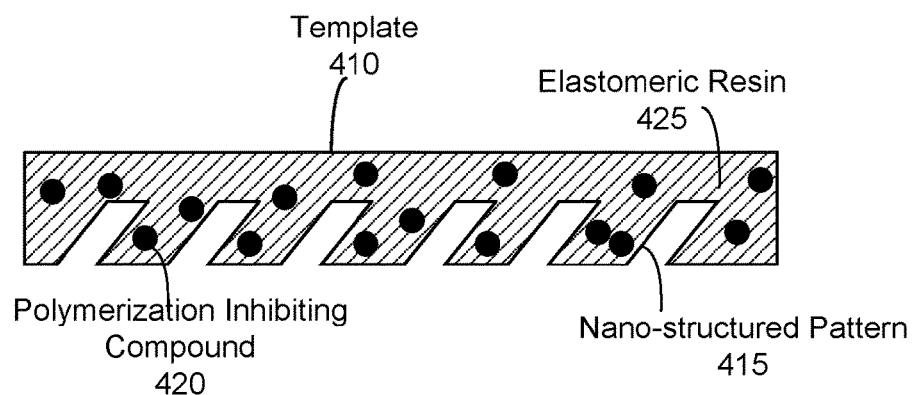
FIGS. 4A through 4D illustrate another NIL process that includes forming a layer of the polymerization inhibiting compound by diffusing the polymerization inhibiting compound from a template, in accordance with an embodiment.

FIGS. 4A through 4D illustrate another NIL process that forms a layer of the polymerization inhibiting compound 420 by diffusing the polymerization inhibiting compound 420 from a template 410, in accordance with an embodiment. FIG. 4A shows a template 410. The template 410 is a soft template and does not have a rigid structure. A surface of the template 410 has a nano-sized pattern. The template 410 is made with a mixture of an elastomeric resin 425 and a polymerization inhibiting compound 420. In one example, the polymerization inhibiting compound 420 and the elastomeric resin 425 are mixed with a ratio in a range from 1:99 to 1:9. In some embodiments, the polymerization inhibiting compound 420 is polymerized into the network of the elastomeric resin 425. In some other embodiments, the polymerization inhibiting compound 420 is not bounded to the elastomeric resin 425.

Figure 4B:
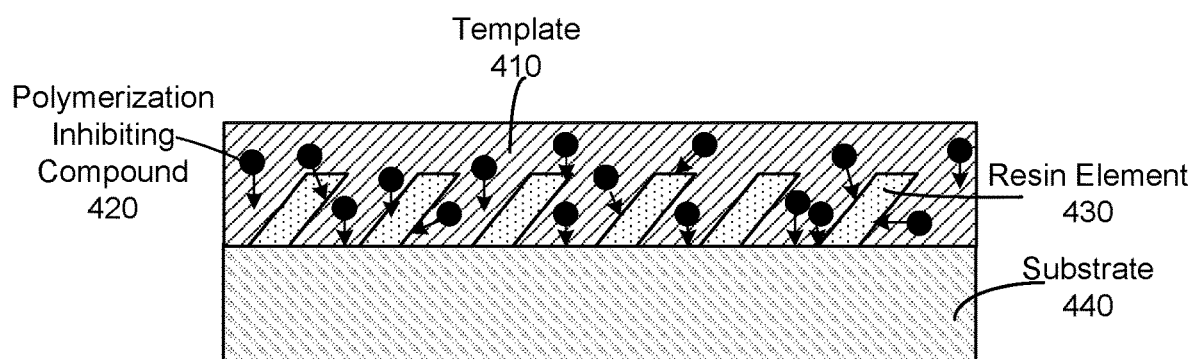

FIG. 4B illustrates that the template 410 is pressed onto a resin element 430 to form a nano-sized structure in the resin element 430. The surface having the nano-sized pattern contacts with the resin element 430. The resin element 430 can be the resin element 130 described above in conjunction with FIG. 1. The resin element 430 is attached on a substrate 440, which can be the substrate 140 in FIG. 1.

In the embodiment of FIGS. 4A-D, the template 410 and the resin element 430 are polymerized with orthogonal chemistries. For example, the template 410 is made by free radical polymerization, while the resin element 430 is made by cationic polymerization, or vice versa. The template 410 is held together with the resin element 430 for a period of time to allow the polymerization inhibiting compound 420 to diffuse from the template 410 to the interface of the template 410 and the resin element 430. The period of time can be five seconds to two minutes. In some embodiments, the template 410 and the resin element 420 are heated while they are being held together to increase the diffusion rate.

Figure 4C:
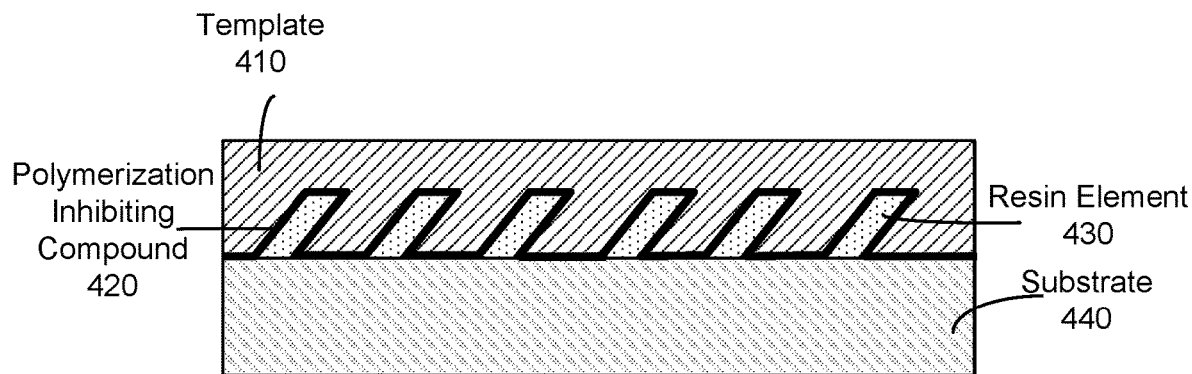

As a result of the diffusion, a layer of the polymerization inhibiting compound 420 is formed at the interface of the template 410 and the resin element 430, as shown in FIG. 4C. The thickness of the layer depends on diffusion depth. In some embodiments, the layer has a thickness of approximately 5 nm to 10 nm. After the diffusion, the resin element 430 is cured, for example, by exposing to ultraviolet light.

Figure 4D:
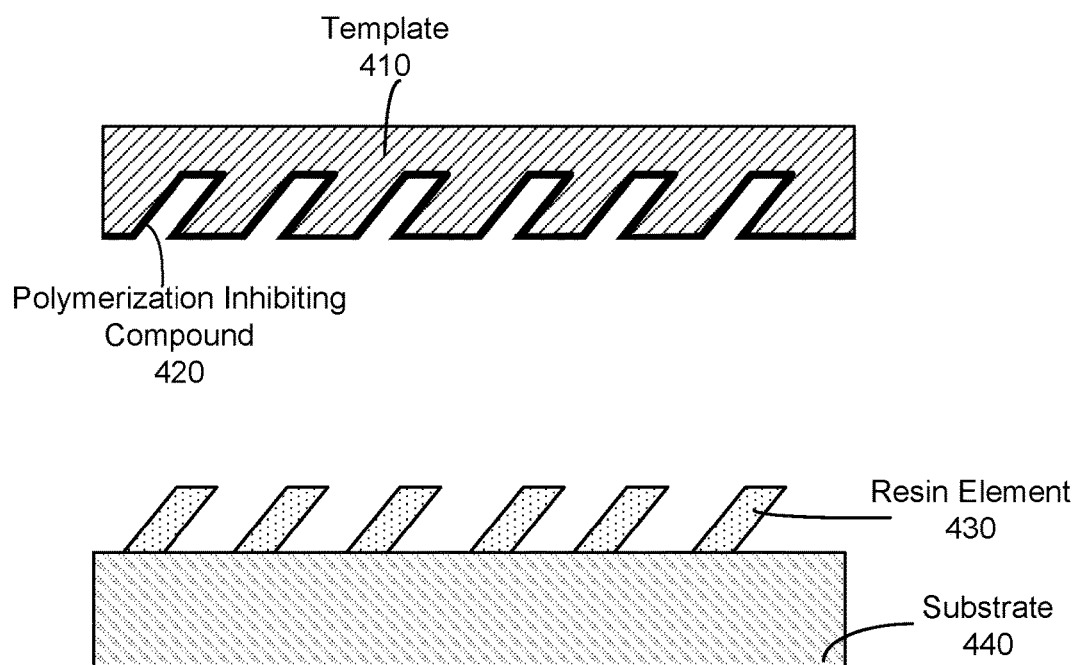

Next, the template 410 is removed from the molded resin element 430, as shown in FIG. 4D. The mold resin element 430 has a nano-sized structure which is a mirror image of the nano-sized pattern 415 of the template 410.

Figure 5:
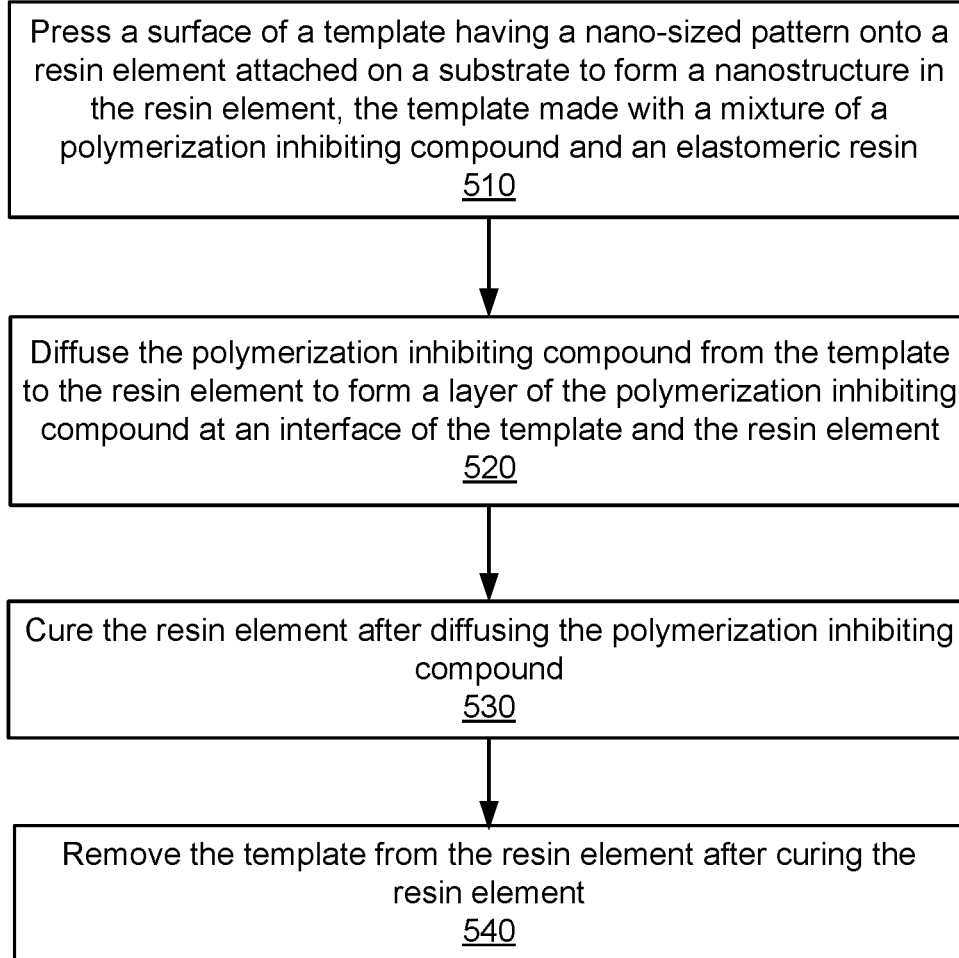
FIG. 5 is a flowchart illustrating the NIL process in FIGS. 4A through 4D, in accordance with an embodiment.

FIG. 5 is a flowchart illustrating the NIL process in FIGS. 4A through 4D, in accordance with an embodiment. The NIL process includes pressing 510 a surface of a template having a nano-sized pattern onto a resin element attached on a substrate to form a nano-sized structure in the resin element. The template is made with a mixture of a polymerization inhibiting compound and an elastomeric resin. The ratio of the polymerization inhibiting compound and elastomeric resin in the mixture is in a range from 1:99 to 1:9. The resin element includes a fluorine resin. The template and the resin element are made with orthogonal polymerization methods.

The NIL process also includes diffusing 520 the polymerization inhibiting compound from the template to the resin element to form a layer of the polymerization inhibiting compound at the interface of the template and the resin element. The diffusion is performed by holding the template together with the resin from five seconds to two minutes. In some embodiments, the diffusion is performed while the template and/or the resin are heated in order to increase the diffusion rate. The layer of the polymerization inhibiting compound formed by the diffusion has a thickness no more than 10 nm.

The NIL process further includes curing 530 the resin element after diffusing the polymerization inhibiting compound. The resin element is cured by being exposed to ultraviolet light. The ML process also includes removing 540 the template from the resin element after curing the resin element. The polymerization inhibiting compound at the interface of the resin element and template prevents adhesive failure during the removing.

Compared with the NIL process in FIG. 3, the NIL process in FIG. 5 does not have the step to prepare the layer of the polymerization inhibiting compound since the layer is formed by diffusion when the template is pressed onto the resin element. However, the layer of the polymerization inhibiting compound that is deposited to the template in FIG. 3 is better conformed to the template.

Figure 6A:
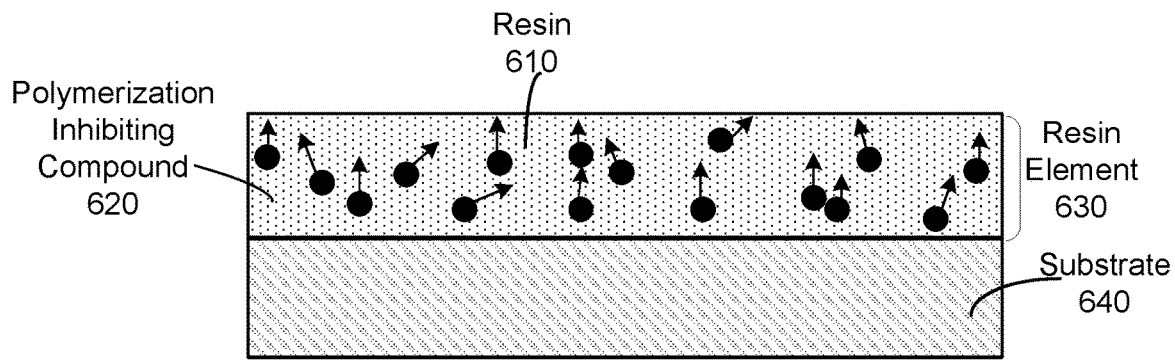
FIGS. 6A through 6E illustrate another NIL process that includes forming a layer of the polymerization inhibiting compound by promoting migration of the polymerization inhibiting compound from a resin element, in accordance with an embodiment.
Figure 6B:
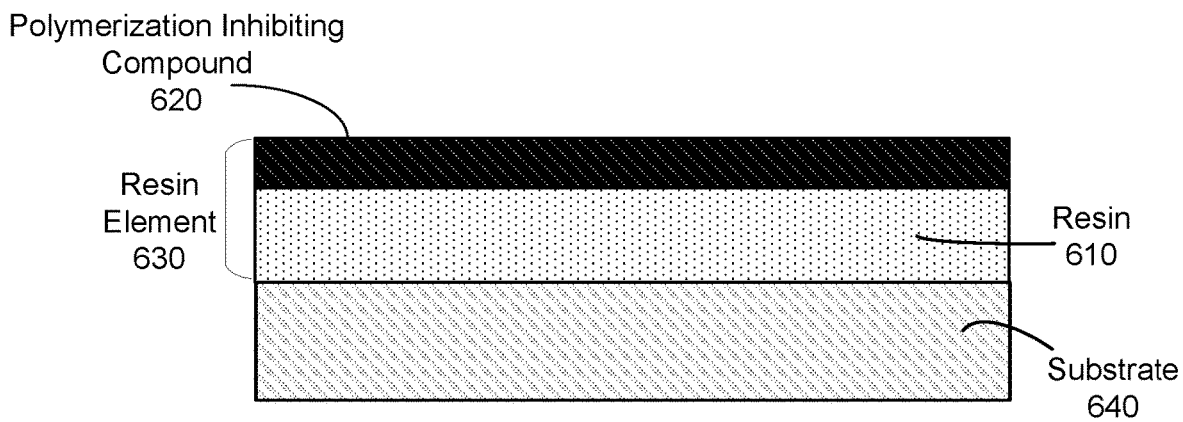

FIGS. 6A through 6E illustrate another NIL process that forms a layer of the polymerization inhibiting compound 620 by promoting migration of the polymerization inhibiting compound 620 from a resin element 630, in accordance with an embodiment. FIG. 6A shows a resin element 630 attached on a substrate 640. A surface of the resin element 630 contacts with the substrate 640 and another surface of the resin element 630 contacts with air. The resin element 630 is a mixture of a resin 610 and a polymerization inhibiting compound 620 at a ratio from 99:1 to 9:1. The resin 610 can be a fluorine resin. The polymerization inhibiting compound 620 can be a perfluorinated compound having low surface energy, such as a perfluorinated phenol. Because the polymerization inhibiting compound 620 has low surface energy, it migrates towards the interface of the resin element 630 and air, as illustrated by the arrows in FIG. 6A. The migration can be promoted by heating the resin element 630. Due to the migration, a layer of polymerization inhibiting compound 620 is formed at the air/resin element 630 interface, as shown in FIG. 6B. The thickness of the layer is below 38 nm. In some embodiments, the thickness of the layer is no more than 10 nm.

Figure 6C:
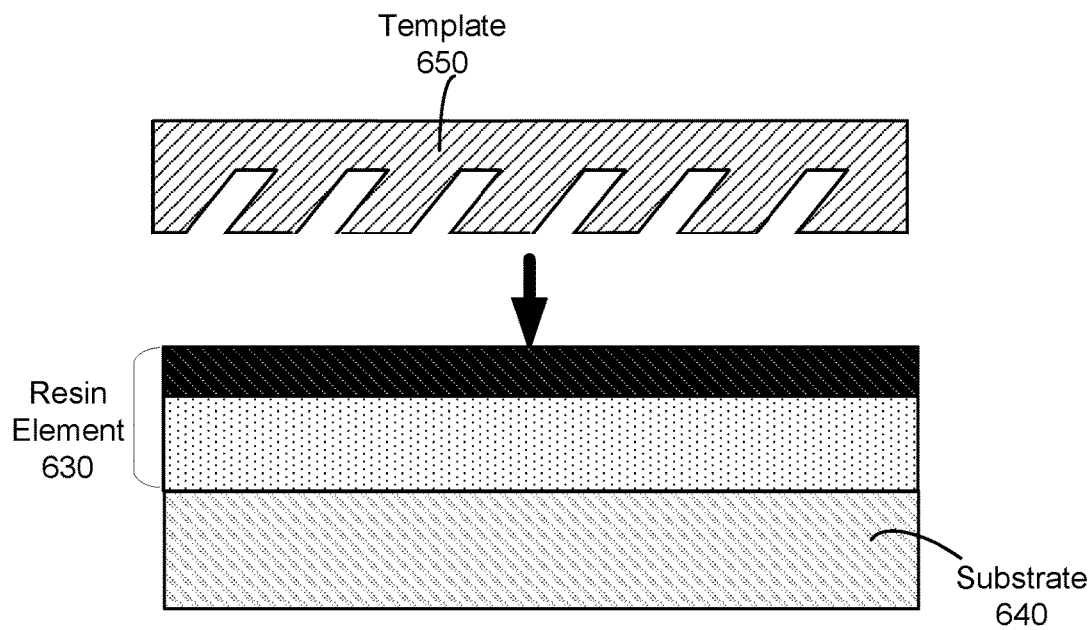
Figure 6D:
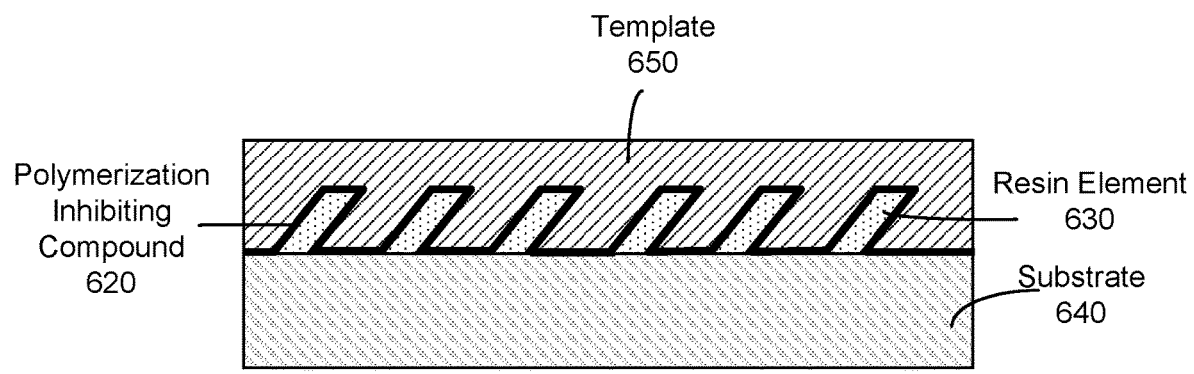
Figure 6E:
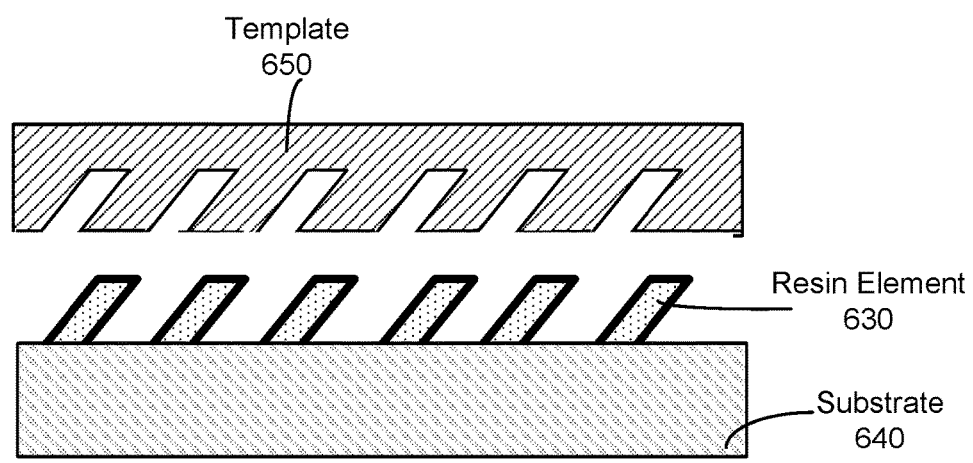

FIG. 6C shows a template 650 is pressed onto the resin element 630. An example of the template 650 is the template 110 described above in conjunction with FIG. 1. In some embodiments, the template 650 is a soft template. The template 650 has a surface having a nano-sized pattern. The surface of the template 650 contacts with the surface of the resin element 630 that has the layer of the polymerization inhibiting compound 620. Thus, the layer of the polymerization inhibiting compound 620 is at the interface of the resin element 630 and template 650. The resin element 630 is molded to have a nano-sized structure that is a mirror image of the nano-sized pattern of the template 640, as shown in FIG. 6D. After the nano-sized structure is formed, the template 650 is removed from the molded resin element 630, as illustrated in FIG. 6E.

Figure 7:
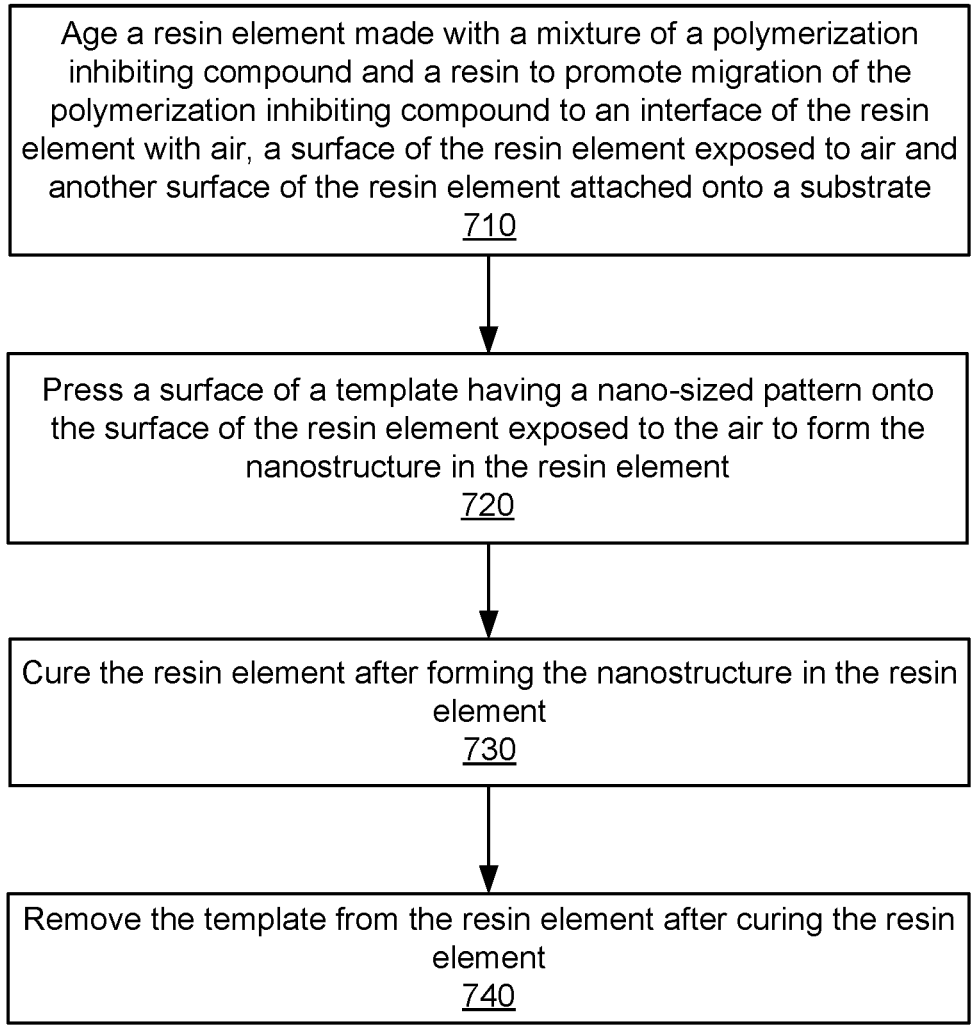
FIG. 7 is a flowchart illustrating the NIL process in FIGS. 6A through 6E, in accordance with an embodiment.

FIG. 7 is a flowchart illustrating the NIL process in FIGS. 6A through 6E, in accordance with an embodiment. The NIL process includes aging 710 a resin element, for example, by heating the resin element. A surface of the resin element is exposed to air and another surface of the resin element is attached onto a substrate. The resin element is spin coated onto the substrate. The resin element is made with a mixture of a polymerization inhibiting compound and a resin. In one embodiment, the polymerization inhibiting compound and resin are mixed at a ratio in a range from 1:99 to 1:9. The resin can be a fluorine resin. The polymerization inhibiting compound can be a perfluorinated compound with polymerization inhibiting functionality. An example is perfluorinated phenol. Due to the low surface energy of the perfluorinated compound, the polymerization inhibiting compound migrates to the air/resin element interface during the aging to form a layer of the polymerization inhibiting compound at the interface. The layer has a thickness from 18 nm to 38 nm. The heating during the aging promotes the migration of the polymerization inhibiting compound to the air/resin element interface.

The NIL process also includes pressing 720 a surface of a template having a nano-sized pattern onto the surface of the resin element exposed to the air to form the nano-sized structure in the resin element. During and after the pressing, the polymerization inhibiting compound remains at the interface of the template and the resin element.

The NIL process further includes curing 730 the resin element after forming the nano-sized structure in the resin element and removing 740 the template from the resin element after curing the resin element. As discussed above, because the polymerization inhibiting compound inhibits polymerization at the interface of the molded resin element and the template, there is no adhesive failure during the removing.

The NIL process has multiple advantages. One advantage is that there is no additional step to prepare the layer of the polymerization inhibiting compound since the layer is formed during the aging process. Another advantage is that the template and the polymerization inhibiting compound does not have to have orthogonal polymerization chemistries since the polymerization inhibiting compound is formed in the resin element. Thus, there are more materials that can be selected as the polymerization inhibiting compound.

What is claimed is:

1. A method for fabricating a nano-sized structure, comprising:
   exposing a surface of a template to oxygen plasma to increase a concentration of hydroxyl groups at the surface having a nano-sized pattern;
   depositing a layer of polymerization inhibiting compound onto the surface of the template, the polymerization inhibiting compound comprising (i) amine, phenol, quinone, nitroso or persistent free radicals and (ii) a compound that reacts and neutralizes with free radical generator used for free radical curing;
   pressing the surface of the template onto a resin element attached on a substrate or the resin element onto the surface of the template to form the nano-sized structure in the resin element, wherein the surface associated with the nano-sized pattern contacts with the resin element;
   free radical curing the resin element after forming the nano-sized structure in the resin element; and
   removing the template from the resin element after curing the resin element.

2. The method of claim 1, wherein depositing the layer of polymerization inhibiting compound is performed by at least one of the following: initiated chemical vapor deposition, atomic layer deposition, physical vapor deposition, or any combination thereof.

3. The method of claim 1, wherein the layer of polymerization inhibiting compound has a thickness no more than 10 nanometers.

4. The method of claim 1, wherein the resin element comprises a fluorine resin.

5. The method of claim 1, wherein the resin element is coated on the substrate by spin coating.

* * * * *